(12) United States Patent
Lagos

(10) Patent No.: US 7,352,554 B2
(45) Date of Patent: Apr. 1, 2008

(54) METHOD FOR FABRICATING A JOHNSEN-RAHBEK ELECTROSTATIC WAFER CLAMP

(75) Inventor: Bryan C. Lagos, Danvers, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 583 days.

(21) Appl. No.: 10/880,895

(22) Filed: Jun. 30, 2004

(65) Prior Publication Data

US 2006/0002052 A1 Jan. 5, 2006

(51) Int. Cl.
- *H01L 21/683* (2006.01)
- *H01T 23/00* (2006.01)
- *H01G 7/02* (2006.01)
- *H05F 3/00* (2006.01)
- *G03G 15/02* (2006.01)

(52) U.S. Cl. ............... 361/234; 361/233; 361/235

(58) Field of Classification Search ......... 361/233–235
See application file for complete search history.

(56) References Cited

U.S. PATENT DOCUMENTS

| | | | | |
|---|---|---|---|---|
| 4,670,690 | A | * | 6/1987 | Ketchpel ................ 313/505 |
| 5,389,159 | A | * | 2/1995 | Kataoka et al. ........... 136/251 |
| 5,764,471 | A | | 6/1998 | Burkhart |
| 5,822,172 | A | | 10/1998 | White |
| 5,825,607 | A | | 10/1998 | Burkhart |
| 6,055,150 | A | | 4/2000 | Clinton et al. |
| 6,406,791 | B1 | * | 6/2002 | Dai et al. ................ 428/432 |
| 2002/0135969 | A1 | | 9/2002 | Weldon et al. |
| 2004/0066601 | A1 | * | 4/2004 | Larsen ................... 361/234 |
| 2006/0180342 | A1 | * | 8/2006 | Takaya et al. ............ 174/256 |

FOREIGN PATENT DOCUMENTS

WO  WO 2004/034461 A1  4/2004

\* cited by examiner

*Primary Examiner*—Michael Sherry
*Assistant Examiner*—Dharti H Patel
(74) *Attorney, Agent, or Firm*—Eschweiler & Associates, LLC

(57) ABSTRACT

The present invention is directed to a J-R electrostatic clamp (ESC) and method for forming same. The ESC comprises a ceramic layer for clamping a wafer thereto, and a plurality of electrodes arranged across the ceramic layer in an interior region and a peripheral region of the backside surface, wherein a plurality of electrode groups are defined by electrodes in the interior regions and peripheral regions. A first insulating layer generally isolates the electrode groups from one another, and an interconnect layer comprising a plurality of electrically conductive vias and interconnects electrically connect the electrodes associated with each respective electrode group. Each electrode group comprises a connection node, wherein the respective electrode group is operable to connect to a respective voltage potential. A second insulating layer generally encapsulates the interconnect layer. The method comprises patterning the electrodes, first insulating layer, interconnect layer, and second insulating layer to form the ESC.

26 Claims, 6 Drawing Sheets

METHOD FOR FABRICATING A JOHNSEN-RAHBEK ELECTROSTATIC WAFER CLAMP

FIELD OF THE INVENTION

The present invention relates generally to semiconductor processing systems, and more specifically to a Johnsen-Rahbek electrostatic clamp and a method for manufacturing the same.

BACKGROUND OF THE INVENTION

Electrostatic clamps or chucks (ESCs) are often utilized in the semiconductor industry for clamping substrates during plasma-based or vacuum-based semiconductor processes such as etching, CVD, and ion implantation, etc. Capabilities of the ESCs, including non-edge exclusion and wafer temperature control, have proven to be quite valuable in processing semiconductor substrates or wafers, such as silicon wafers. A typical ESC, for example, comprises a dielectric layer positioned over a conductive electrode, wherein the semiconductor wafer is placed on a surface of the ESC (e.g., the wafer is placed on a surface of the dielectric layer). During semiconductor processing (e.g., plasma processing), a clamping voltage is typically applied between the wafer and the electrode, wherein the wafer is clamped against the chuck surface by electrostatic forces.

A subset of electrostatic clamps, referred to as Johnsen-Rahbek (J-R) clamps, utilize "leaky" dielectric layers (e.g., semiconductive dielectric layers having bulk resistances of between approximately $1\times10^9$ to $1\times10^{12}$ Ohm-cm) in contact with the wafer, wherein greater clamping forces can be achieved at lower voltages than with conventional non-J-R clamps. Lower voltage input to the ESC typically not only reduces power supply requirements associated with the J-R clamps, but further provides a clamping environment that is potentially less destructive to the wafer and devices formed thereon.

A conventional J-R clamp, for example, comprises a dielectric layer that is slightly conductive, thus generally permitting a thickness of the dielectric layer (e.g., a ceramic) to be much thicker than would be permitted for a "classic" or Coulombic ESC. Such an increase in thickness greatly facilitates the clamp manufacturing process, while also reducing clamp operating voltages. For example the dielectric layer can be used as a base for the formation of positive and negative electrodes by screen printing and firing of a dielectric paste. However, a charge transfer typically resulting from the use of a semiconductor dielectric, for example, can also transmit a charge to the wafer, therein generating residual clamping forces that can result in a delay in releasing the wafer from the clamp. To mitigate the effects of residual clamping forces, A/C clamping voltages utilizing multiple groups of electrodes (e.g., multi-phasing or polyphasing) can be used. However, such A/C clamping voltages and multiple groups of electrodes typically necessitate that each electrode have its area distributed somewhat evenly across the clamp the resulting electrode structures can be quite complicated because of the design constraints driven by the need to maximize clamping area and force.

One approach to produce such a complicated structure is to break each electrode into multiple individual areas. However, this typically comprises a formation of multiple electrical connections to the various electrode areas, which can be quite cumbersome, thus making such a clamp impractical. Therefore, a need exists in the art for a multiple-electrode clamp that reduces the number of electrical connections to the clamp, wherein reliability is increased, while also reducing production costs.

SUMMARY OF THE INVENTION

The present invention overcomes the limitations of the prior art. Consequently, the following presents a simplified summary of the invention in order to provide a basic understanding of some aspects of the invention. This summary is not an extensive overview of the invention. It is intended to neither identify key or critical elements of the invention nor delineate the scope of the invention. Its purpose is to present some concepts of the invention in a simplified form as a prelude to the more detailed description that is presented later.

The present invention is directed generally toward a J-R electrostatic clamp (ESC) for electrostatically clamping a substrate such as a semiconductor wafer. The present invention is further directed toward a method for making a reliable J-R ESC, wherein electrical connections to the ESC are generally simplified. In accordance with one exemplary aspect of the present invention, the ESC comprises a ceramic layer having a clamping surface whereon the wafer resides, and a backside surface generally opposite the clamping surface. A plurality of electrically conductive electrodes are generally arranged across the backside surface of the ceramic layer in a predetermined manner, wherein the plurality of electrodes are distributed about an interior region and a peripheral region of the backside surface thereof. The distribution of the plurality of electrodes according to the present invention advantageously permits a uniform electrostatic clamping of the wafer.

Each electrode in the interior region, for example, is associated with a respective one or more electrodes in the peripheral region, therein generally defining a plurality of electrode groups. A first insulating layer, for example, is formed over and between the plurality of electrode groups, therein electrically isolating the plurality of electrode groups from one another. According to another example, the first insulating layer generally encapsulates the plurality of electrodes, therein generally preventing electrical breakdown of the plurality of electrodes.

According to another exemplary aspect of the present invention, an interconnect layer comprising a plurality of electrically conductive vias and interconnects generally resides over the first insulating layer, wherein the plurality of vias generally extend through the first insulating layer and electrically connect to each of the plurality of electrodes. The plurality of interconnects further electrically connect the respective vias associated with each electrode group, therein providing a less complicated interconnection between the plurality of electrodes. The interconnect layer further comprises a connection node electrically connected to each electrode group, wherein each node is operable to electrically connect to a respective voltage potential. Such an interconnect layer generally simplifies electrical connections to the electrodes of the ESC, while further providing a more reliable and robust clamp. The interconnect layer, for example, is further encapsulated by a second insulating layer, therein further preventing electrical breakdown of the interconnect layer, while also generally electrically insulating a backside of the ESC.

In accordance with another exemplary aspect of the present invention, a method for making the J-R ESC is disclosed, wherein the plurality of electrodes, first insulating layer, interconnect layer, and second insulating layer are patterned over the ceramic layer. Electrically-conductive and electrically-insulative pastes are utilized to form the respective electrodes, first insulating layer, interconnect layer, and second insulating layer, wherein the pastes are patterned over the ceramic layer and cured, such as by firing in a kiln. Furthermore, one or more electrical connections can be made to the interconnect layer, wherein the electrical connections electrically connect the plurality of electrodes of the ESC to a respective voltage potential.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

Figure 1:
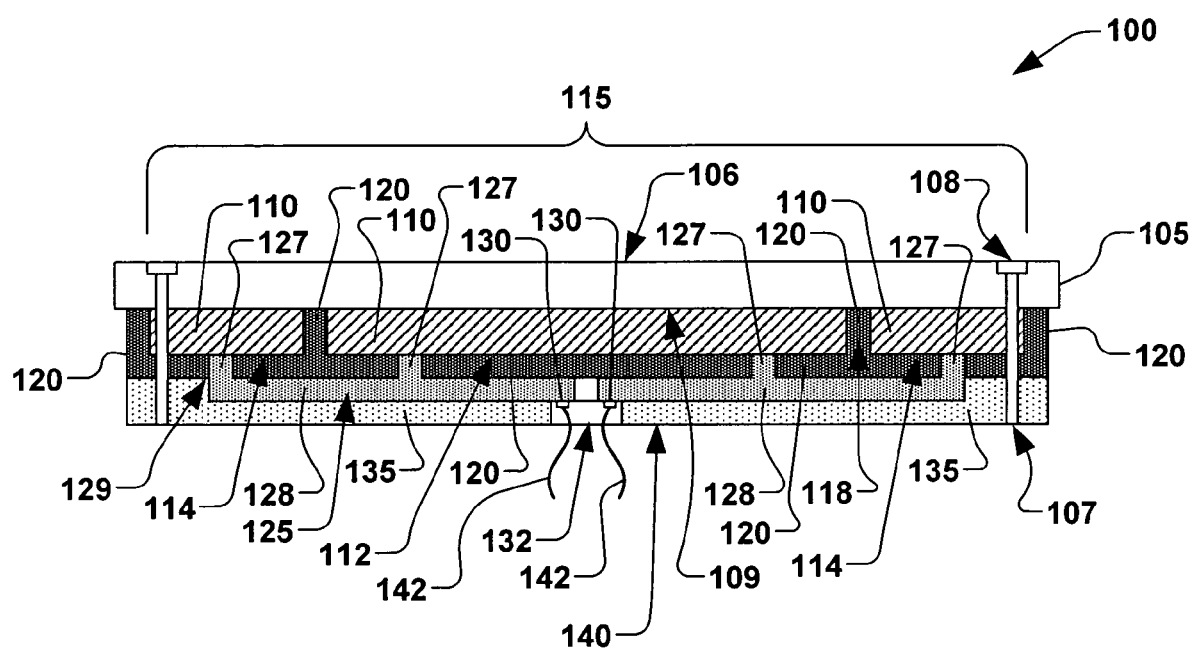
FIG. 1 is a partial cross-sectional view of an exemplary J-R electrostatic clamp according to one aspect of the present invention.

The present invention is directed generally towards an electrostatic clamp for maintaining a position of a semiconductor substrate or wafer. More particularly, the invention is directed toward an economical Johnsen-Rahbek (J-R) electrostatic clamp and method of manufacturing same, wherein the J-R clamp is operable to provide a uniform and reliable clamping force. Accordingly, the present invention will now be described with reference to the drawings, wherein like reference numerals are used to refer to like elements throughout. It should be understood that the description of these aspects are merely illustrative and that they should not be taken in a limiting sense. In the following description, for purposes of explanation, numerous specific details are set forth in order to provide a thorough understanding of the present invention. It will be evident to one skilled in the art, however, that the present invention may be practiced without these specific details.

Referring now to the figures, FIG. 1 illustrates a partial cross-section of an exemplary J-R electrostatic clamp 100, also referred to as an "ESC". The ESC 100 is operable to substantially clamp a substrate (not shown), such as a semiconductor wafer, thereto by electrostatic force. The ESC 100, for example, comprises a ceramic layer 105 having a clamping surface 106 associated therewith, wherein the wafer (not shown) generally resides on the clamping surface during electrostatic clamping. The ceramic layer 105, for example, is comprised of a doped J-R type ceramic substrate (e.g, alumina doped with titanium, aluminum nitride doped with cerium oxide, or the like). A doped J-R ceramic substrate (e.g., a semiconductive dielectric material having a bulk resistance between $1\times10^8$ to $1\times10^{12}$ Ohm-cm) has an advantage over non-doped materials because the substrate can be substantially thick (e.g., a thickness of 0.5 mm or more), and does not require subsequent thinning by machining, grinding, or other techniques in order to produce useful clamping forces. The ceramic layer 105, for example, may further comprise one or more gas holes 107 and one or more distribution grooves 108 formed therein, such as by machining the ceramic substrate, wherein gas cooling of the wafer (not shown) can be achieved during operation of the ESC 100.

Figure 2:
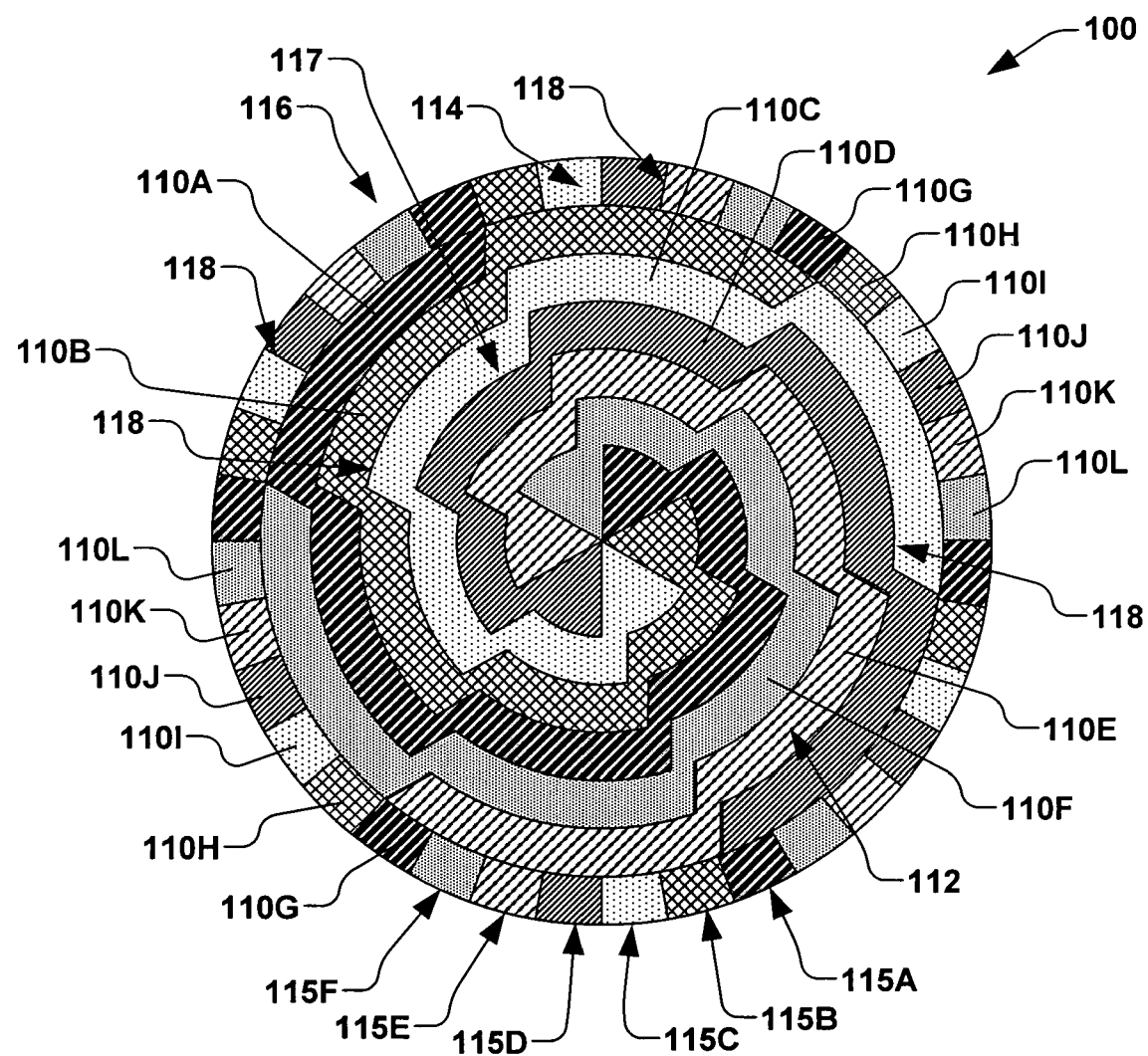
FIG. 2 is a plan view of an exemplary J-R electrostatic clamp having electrodes arranged in a predetermined manner according to another aspect of the present invention.

The ceramic layer 105 further comprises a backside surface 109 that is generally opposite the clamping surface 106, wherein a plurality of electrically conductive electrodes 110 are arranged across the backside surface of the ceramic layer. The plurality of electrodes 110, for example, are arranged in a predetermined manner, wherein the plurality of electrodes are generally distributed about an interior region 112 and a peripheral region 114 of the backside surface 109, wherein each electrode in the interior region is associated with a respective one or more electrodes in the peripheral region, therein generally defining a plurality of electrode groups 115. According to one exemplary aspect of the present invention, FIG. 2 illustrates a plan view of the exemplary ESC 100, wherein the plurality of electrodes 110A-110L are arranged in a predetermined pattern 116. It should be noted that the predetermined pattern 116 in which the plurality of electrodes 110 are generally arranged can differ from that illustrated in the figures, and all such patterns are contemplated as falling within the scope of the present invention.

The ESC 100 of FIG. 2, for example, illustrates an electrode pattern 116 generally comprised of six electrode groups 115A-115F. For example, electrode group 115A comprises electrode 110A in the interior region 112 of the ESC 100, and electrodes 110G in the peripheral region 114. Likewise, electrode group 115B comprises electrode 110B and electrodes 110H, and so on. Furthermore, in this example, electrodes 110A-110F associated with the interior region 112 are electrically connected to the respective electrodes 110G-110L in the peripheral region 114, thus defining the six electrode groups 115A-115F, as will be discussed infra.

It should be noted that the ESC 100 may comprise any number of electrode groups 115 (e.g., a larger number of electrode groups to provide a more distributed electrostatic force on the wafer), and all such electrode groups are further contemplated as falling within the scope of the present invention. Furthermore, the electrode pattern 116 and a configuration of the plurality of electrodes 110 associated with the interior region 112 and peripheral region 114 can vary. For example, the electrode pattern 116 of FIG. 2 illustrates a generally spiral configuration 117 of the electrodes 110A-110F associated with the interior region 112, while the electrodes 110G-110L associated with the peripheral region generally follow the perimeter of the ESC 100. Alternatively, the electrodes 110 associated with the interior region 112 can be substantially pie-shaped, circular about the center of the ESC 100, or any other shape. Likewise, the electrodes 110 associated with the peripheral region 114 can be of any shape or number, and all such shapes and numbers of electrodes 110 associated with the interior region 112 and peripheral region are contemplated as falling with the scope of the present invention.

The electrodes 110 associated with the peripheral region 114, for example, are utilized to substantially clamp a peripheral portion of the wafer (not shown) during operation of the ESC 100. For example, when utilizing A/C clamping voltages or when alternating power input between the plurality of electrode groups 115, a predetermined distribution of the plurality of electrodes 110 (e.g., the electrode pattern 116) about the interior region 112 and peripheral region 114 of the ESC 100 can generally prevent deleterious "fluttering" of the wafer (not shown) during clamping. Furthermore, according to another example, providing several electrodes 110 associated with the peripheral region 114 for each electrode group 115 further distributes clamping forces associated with the periphery of the wafer, thus limiting "lifting" of the wafer during the aforementioned clamping operations. It should be noted that the present invention advantageously allows for a large number of electrodes 110 to be distributed about the interior region 112 and peripheral region 114 of the ESC 100, as will be described infra.

Referring again to FIG. 1, the plurality of electrodes 110 are formed, in one example, by screening and firing an electrically conductive paste (not shown), such as trade name QM17 or QM22 manufactured by DuPont Corporation, over the backside surface 109 of the ceramic layer 105. The electrically conductive paste (not shown) is applied onto the backside surface 109 of the ceramic layer 105, for example, wherein the ceramic layer and electrically conductive paste are subsequently fired in order to form the plurality of electrodes 110, as will be described in more detail hereafter. Alternatively, the electrically conductive paste is comprised of an electrically conductive epoxy, or the like, wherein the plurality of electrodes are formed by curing the epoxy. According to one example, the plurality of electrodes 110 are comprised of one or more of silver, an alloy of silver, gold, and an alloy of gold, however, other electrically conductive materials can also be used, and all such alternative materials are contemplated as falling within the scope of the present invention. Furthermore, the plurality of electrodes 110 are generally separated from one another by one or more gaps 118. The one or more gaps 118, for example, are quite small (e.g., less than 2 mm), wherein an area of the backside surface covered by the plurality of electrodes 110 is maximized.

According to another exemplary aspect of the present invention, the ESC 100 comprises a first insulating layer 120 that is formed between the plurality of electrode groups 115 (e.g., within the one or more gaps 118), wherein the first insulating layer generally electrically isolates the plurality of electrode groups from one another. The first insulating layer 120, for example, may be further formed over the plurality of electrodes 110, therein encapsulating the plurality of electrodes in an insulative environment, thus further providing a barrier for electrical breakdown of the plurality of electrodes. The first insulating layer 120, for example, comprises a dielectric material, such as a dielectric paste that has been fired at a predetermined temperature, therein forming a glass. One exemplary dielectric paste is comprised of a screen-printable glass (e.g., trade name QM44 dielectric material manufactured by DuPont Corporation) that is formed over the electrodes and subsequently fired to transform the paste into a generally rigid first insulating layer 120, as will be described infra. Alternatively, the dielectric paste comprises a dielectric epoxy that is formed over the electrodes and subsequently cured.

Furthermore, the first insulating layer 120 may be comprised of a plurality of formed layers (not shown), wherein the plurality of formed layers generally form the first insulating layer. For example, the dielectric paste may be applied between and/or over the plurality of electrodes and subsequently cured (e.g., fired in a kiln), wherein another application and cure of the dielectric paste is subsequently performed to build a thickness of the first insulating layer 120.

Figure 3:
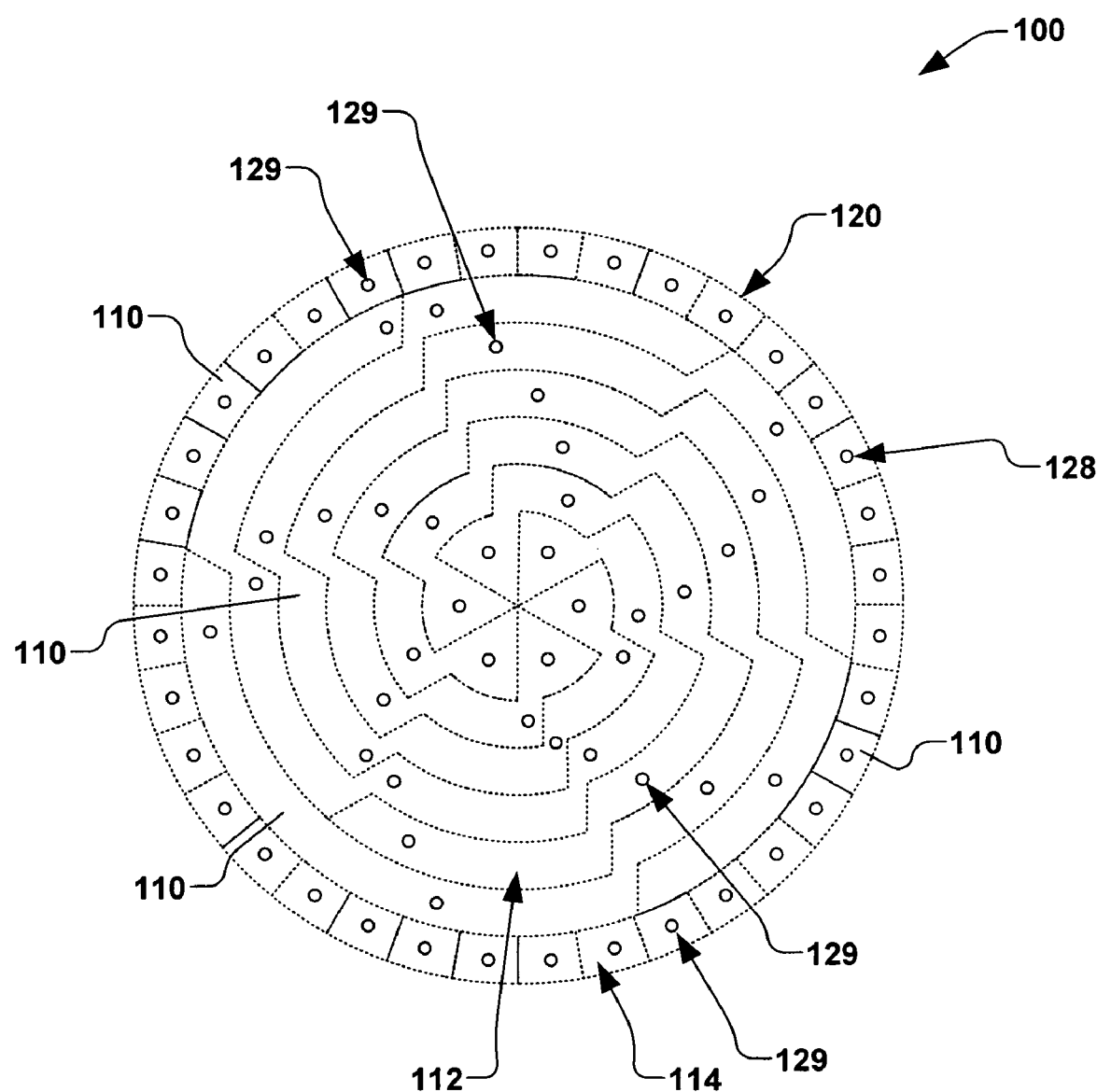
FIG. 3 is a plan view of an exemplary ESC having via regions associated with the plurality of electrodes according to yet another aspect of the present invention.

The ESC 100 further comprises an interconnect layer 125 associated with the plurality of electrodes 110, wherein the interconnect layer generally electrically connects the electrodes of each electrode group 115. The interconnect layer 125, for example, is comprised of one or more silver, an alloy of silver, gold, an alloy of gold, or any other suitable electrically conductive material. The interconnect layer 125, for example, comprises a plurality of electrically conductive vias 127 and interconnects 128, wherein the plurality of vias generally extend through the first insulating layer 120 and electrically contact or connect each of the plurality of electrodes 110 to a respective interconnect. For example, as illustrated in FIG. 3, during the formation of the first insulating layer 120, portions 129 of the first insulating layer associated with the plurality of vias 127 of FIG. 1 are masked in order to provide for electrical connections to the respective electrodes 110 (shown in phantom in FIG. 3) through the first insulating layer. Therefore, after formation of the first insulating layer 120, the first insulating layer generally covers the plurality of electrodes 110, except for the masked portions 129.

Figure 4:
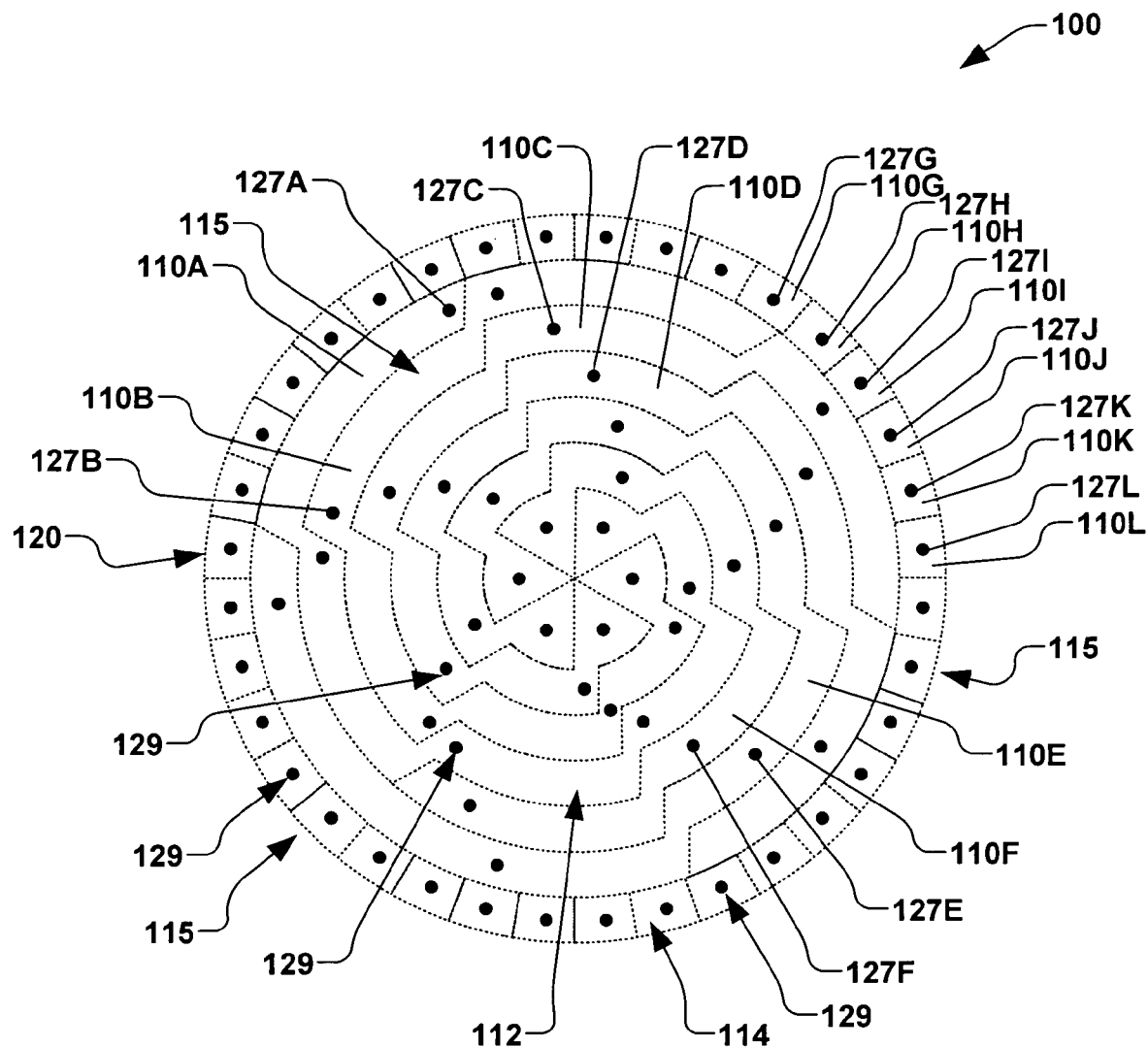
FIG. 4 is a plan view of an exemplary ESC comprising filled vias associated with the plurality of electrodes according to yet another aspect of the present invention.

The plurality of vias 127 are illustrated in FIG. 4, for example, after being formed within the masked portions 129 of the first insulating layer 120. The plurality of vias 127, for example, are formed by screen-printing and firing a dielectric or metal such as silver (e.g., trade name QM17 manufactured by DuPont Corporation) within the portions 129 of the first insulating layer 120, as will be discussed infra. Alternatively, the plurality of vias can be formed by screening and curing a dielectric or conductive epoxy. Each of the plurality of electrodes 110 (shown in phantom), for example, are therefore electrically connected to at least one via 127, wherein the electrodes 110A-110F of the interior region 112 each electrically connect to at least one respective via 127A-127F, and the electrodes 110G-110L of the peripheral region 114 each electrically connect to at least one respective via 127G-127L.

Figure 5:
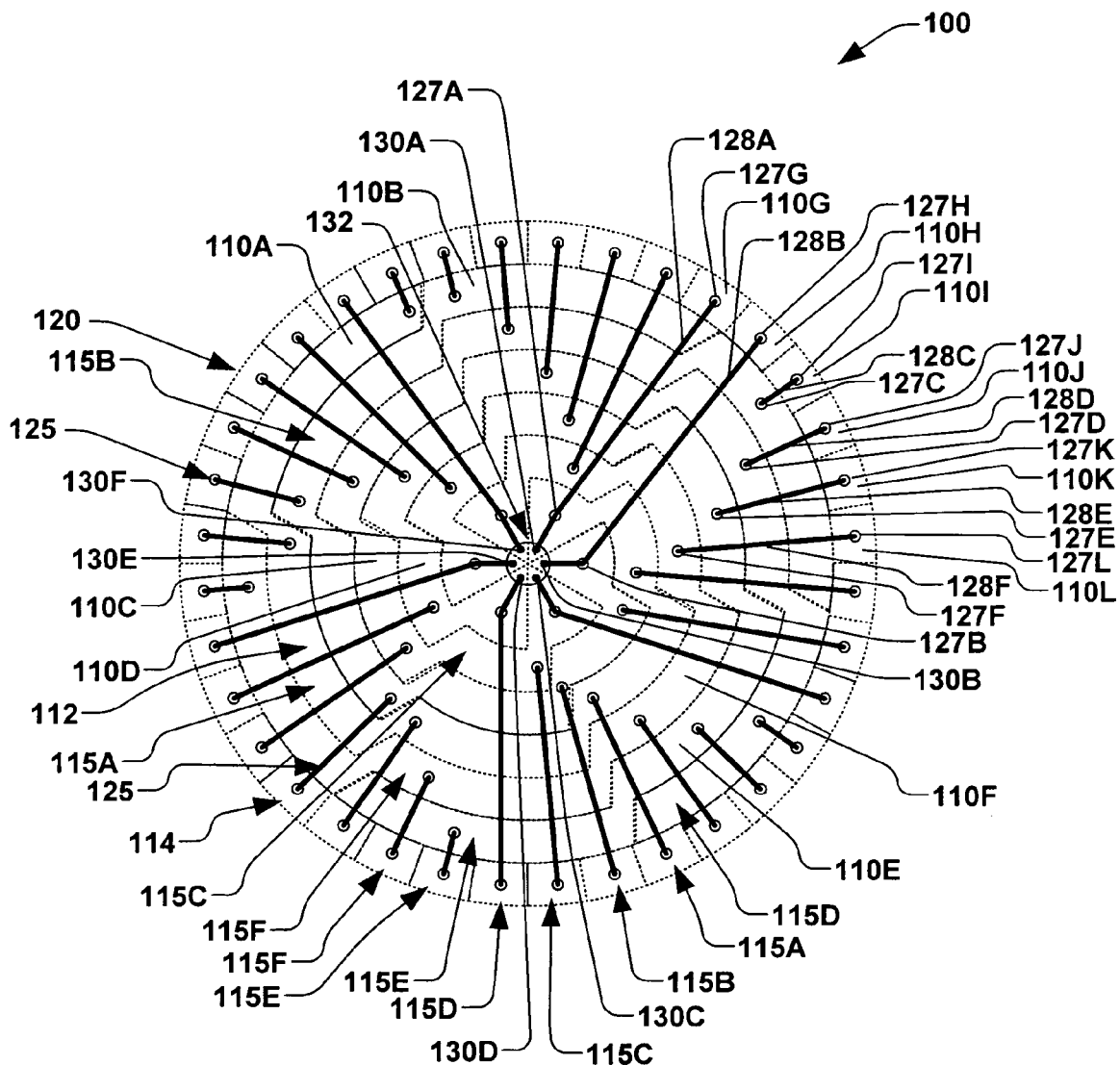
FIG. 5 is a plan view of an exemplary interconnection of the plurality of electrodes according to still another aspect of the present invention.

FIG. 5 illustrates the exemplary ESC 100, wherein the plurality of interconnects 128, for example, are formed over the first insulating layer 120. The plurality of interconnects 128, for example, electrically connect the respective vias 127 associated with each electrode group 115. For example, interconnect 128A electrically connects via 127A and 127G associated with electrodes 110A and 110G, therein electrically connecting electrode group 115A. Likewise, interconnect 128B electrically connects via 127B and 127H associated with electrodes 110B and 110H, therein electrically connecting electrode group 115B, and so on. Such an interconnection of electrodes 110 generally simplifies the electrical connection of the electrodes 110A-110F of the interior region 112 to the electrodes 110G-110L of the peripheral region 114.

Therefore, as stated above, the present invention advantageously allows for a large number of electrodes 110 to be distributed about the interior region 112 and peripheral region 114, such as shown in the electrode pattern 116 of FIG. 2, by simplifying the interconnection between the plurality of electrodes. Consequently, the present invention advantageously provides a greater degree of design flexibility when determining a number, shape, and orientation of electrodes 110 across the ESC 100. Accordingly, the present invention allows for a substantially large number of electrodes 110 to be distributed about the interior region 112 and the peripheral region 114, as well as a large number of electrode groups 115, while maintaining a generally simple, reliable, and practical interconnection therebetween.

The plurality of interconnects 128, for example, are comprised of substantially the same material as the plurality of vias 127, wherein the plurality of interconnects are formed in a similar manner to the formation of the plurality of vias (e.g., by screening and firing an electrically conductive paste or by screening and curing an electrically conductive epoxy). Alternatively, the plurality of interconnects 128 are comprised of a different electrically conductive material and/or formed in a different manner than the formation of the plurality of vias 127, and all such materials and/or formations are contemplated as falling within the scope of the present invention.

Referring again to FIG. 1, in accordance with another exemplary aspect of the present invention, the interconnect layer 125 further comprises a connection node 130 associated with each electrode group 115, wherein each connection node is operable to be electrically connected to a respective voltage potential, therein electrically connecting the voltage potential to the respective plurality of electrode groups 115. For example, each connection node 130A-130F is electrically connected to the respective electrode group 115A-115F at a connection region 132 of the ESC 100. The connection region 132, in one example, is masked during the formation of the first insulating layer 120, wherein the connection nodes 130 are generally directly connected to the respective plurality of electrodes 110. Alternatively, each connection node 130 is formed over the first insulating layer 120 and electrically connected to the respective electrode 110 by an interconnect 128.

According to yet another exemplary aspect of the invention, the ESC 100 of FIG. 1 further comprises a second insulating layer 135, wherein the second insulating layer is generally formed over the interconnect layer 125, except for the connection region 132 associated with the connection nodes 130. The second insulating layer generally encapsulates the interconnect layer 125, therein generally preventing electrical breakdown of the interconnect layer and/or insulating a backside 140 of the ESC 100. The second insulating layer 135, for example, is comprised of a similar material as the first insulating layer 120, wherein the second insulating layer is formed by applying and firing or curing a dielectric paste or epoxy over the interconnect layer 125. The connection region 132 associated with each connection node 130 generally permits the respective connection node to be electrically connected to the respective voltage potential (not shown), such as by soldering a wire 142 to each respective connection node. Alternatively, conductive epoxy, conductive adhesive, or other types of electrical connections may be used to electrically connect each connection node 130 to the respective voltage potential (e.g., a power supply). Furthermore, the one or more holes 107 associated with gas distribution channels 108, for example, may be further formed through the ESC 100, such as by a mechanical operation such as drilling, or by masking operations during the formation of the electrodes 110 and first and second insulating layers 120 and 135.

Figure 6:
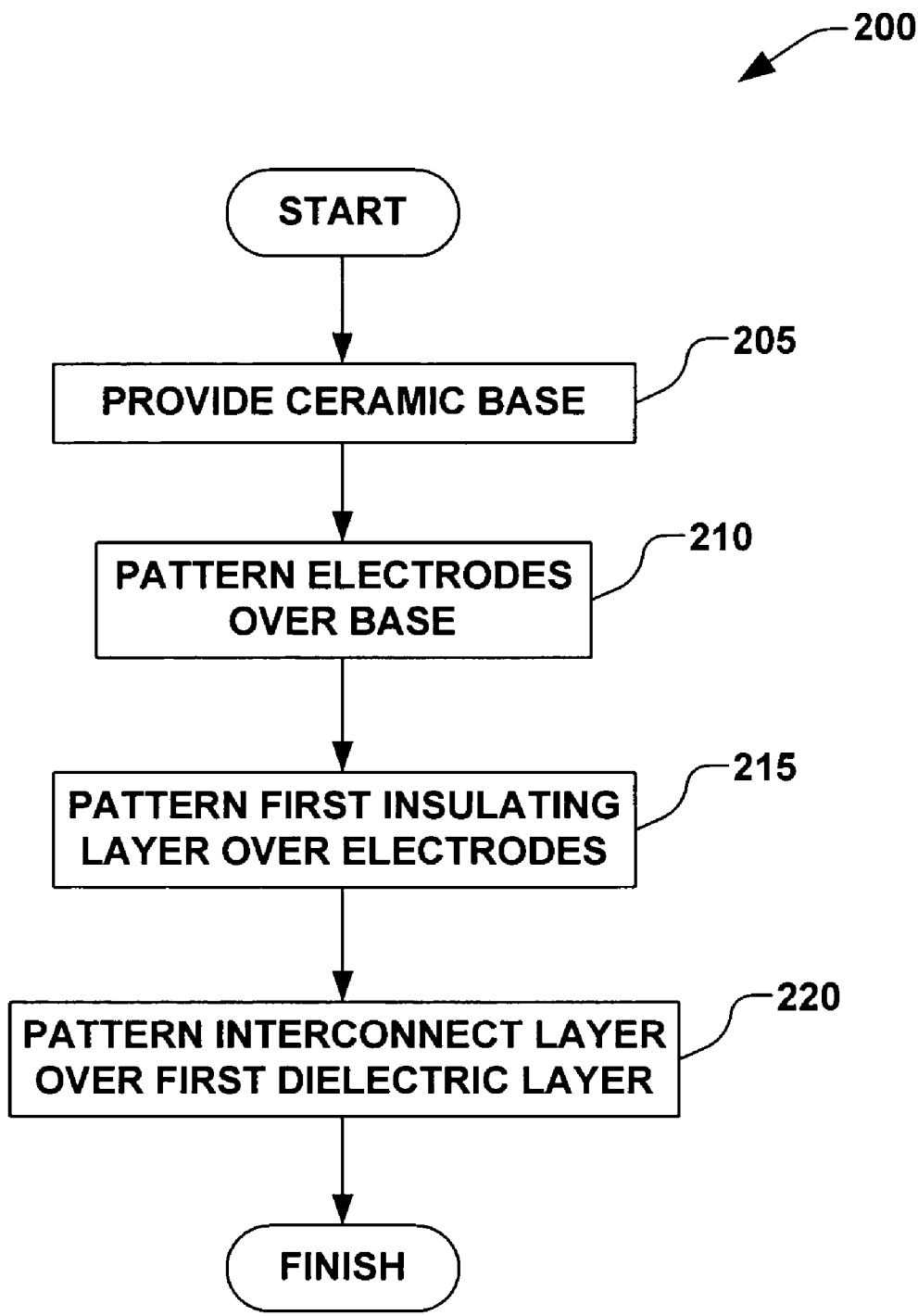
FIG. 6 is a block diagram of a method for manufacturing a J-R electrostatic clamp according to another exemplary aspect of the invention.

According to still another exemplary aspect of the present invention, FIG. 6 is a schematic block diagram of an exemplary method 200 illustrating a method of manufacturing the exemplary electrostatic chuck 100 of FIG. 1. While exemplary methods are illustrated and described herein as a series of acts or events, it will be appreciated that the present invention is not limited by the illustrated ordering of such acts or events, as some steps may occur in different orders and/or concurrently with other steps apart from that shown and described herein, in accordance with the invention. In addition, not all illustrated steps may be required to implement a methodology in accordance with the present invention. Moreover, it will be appreciated that the methods may be implemented in association with the systems illustrated and described herein as well as in association with other systems not illustrated.

As illustrated in FIG. 6, the method 200 begins with providing a ceramic base in act 205. The ceramic base, for example, comprises a J-R ceramic material suitable for providing a clamping surface for a semiconductor wafer. In act 210, a plurality of electrodes are patterned over a backside surface of the ceramic base. The plurality of electrodes, for example, are patterned over the backside of the ceramic base by masking the ceramic base to define the plurality of electrodes, wherein the plurality of electrodes are separated from one another by one or more gaps or insulative regions. An electrically conductive paste or epoxy is then applied over the mask and base, and the mask is subsequently removed from the base. A curing process involving the ceramic base and electrically conductive paste or epoxy are further undergone, wherein the electrically conductive paste or epoxy is generally solidified, thus providing a generally solid plurality of electrodes. For example, the curing process comprises firing (e.g., heating in a kiln) the ceramic base and the electrically conductive paste to a predetermined temperature, wherein the electrically conductive paste is generally solidified after cooling. Act 210 may be further repeated in order to further build a thickness of the plurality of electrodes.

In act 215, a first dielectric layer is patterned over the plurality of electrodes, wherein the first insulating layer generally electrically insulates the plurality of electrodes from one another. The first insulating layer further generally encapsulates the plurality of electrodes, therein generally preventing electrical breakdown of the plurality of electrodes. Patterning the first dielectric layer in act 215, for example, generally comprises applying a mask over the backside surface of the ceramic base and plurality of electrodes. The mask, for example, generally defines a plurality of via regions over the plurality of electrodes, wherein the via regions are generally masked. An electrically insulating paste or insulating epoxy is then applied over the backside surface, electrodes, and mask, and the mask is removed from the backside surface and electrodes.

Consequent to the removal of the mask, the electrically insulating paste or epoxy is generally removed from or not allowed to be applied to the via regions due to the mask, wherein the plurality of electrodes are generally exposed in plurality of via regions. The electrically insulative paste or epoxy is subsequently fired (or cured) and cooled, wherein the electrically insulative paste or epoxy is generally solidified (e.g., the ceramic base, plurality of electrodes, and insulative paste are fired in a kiln to a predetermined temperature). For example, the electrically insulative paste is generally transformed into a generally rigid glass layer that generally encapsulates the plurality of electrodes. Act 215 may be further repeated in order to further build a thickness of the first insulating layer, such as to provide a thickness of the first insulating layer that is adequate to generally prevent electrical breakdown of the plurality of electrodes. Alternatively, patterning the first insulating layer may comprise an application of insulative spaces (e.g., an insulative sheet) over and between the plurality of electrodes, wherein curing or firing of the first insulating layer is not necessary.

In act 220, an electrically conductive interconnect layer is patterned over the first insulating layer, therein forming a plurality of vias and interconnects. The interconnect layer generally electrically connects two or more of the plurality of electrodes, therein defining a plurality of electrode groups. For example, patterning the interconnect layer comprises applying a mask over the first insulating layer and plurality of electrodes, wherein the mask generally defines one or more of a plurality of via regions associated with the plurality of electrodes and a plurality of interconnect regions generally connecting two or more of the plurality of via regions. An electrically conductive paste or epoxy is then applied over the first insulating layer, plurality of electrodes, and mask, wherein the electrically conductive paste or epoxy generally fills the plurality of via regions and interconnect regions. The mask is further removed from the first insulating layer and plurality of electrodes, wherein the plurality of vias and interconnects are generally defined by the electrically conductive paste or epoxy. The electrically conductive paste or epoxy is further cured (e.g., fired in a kiln to a predetermined temperature), wherein the electrically conductive paste or epoxy is generally solidified. Act 220 may be further repeated in order to further build a thickness of the interconnect layer, such as to provide a thickness that is adequate for proper electrical conduction to the plurality of electrodes. A power source can subsequently be electrically connected to the plurality of electrodes by a respective connection of a wire thereto, such as by soldering the wire to an interconnect, via, or directly to an electrode. Alternatively, an electrically conductive adhesive can be used to electrically connect the wire.

In one alternative, the patterning the interconnect layer in act 220 comprises applying a first mask over the first insulating layer and plurality of electrodes to generally define via regions associated with the plurality of electrodes, wherein a first electrically conductive paste or epoxy generally fills the via regions. The first mask is removed, and the first electrically conductive paste or epoxy is subsequently cured (e.g., fired in a kiln) to generally solidify the first electrically conductive paste or epoxy and define the plurality of vias. A second mask is further applied over the first insulating layer and plurality of electrodes, to generally define the plurality of interconnect regions. Subsequent application of a second electrically conductive paste or epoxy over the second mask, for example, generally fills the plurality of interconnect regions. The second mask is then removed and the second electrically conductive paste or epoxy is cured (e.g, fired in a kiln and cooled) to generally solidify and define the plurality of interconnects. The first electrically conductive paste or epoxy and second electrically conductive paste or epoxy, for example, are different from one another, in order to suit the appropriate filling of vias or interconnects. Alternatively, the first and second conductive pastes or epoxies are generally comprised of the same or similar material. Furthermore, the masking and curing of the individual via regions and interconnect regions may be individually repeated in order to further build a thickness the respective vias or interconnects.

According to anther exemplary aspect of the invention, a second insulating layer is patterned over the interconnect layer. For example, after act 220 is performed, the second insulating layer is patterned over the interconnect layer in order to generally encapsulate the interconnect layer and electrically insulate a backside of the electrostatic chuck, except for a connection region associated with an electrical connection to the plurality of interconnects. For example, patterning the second insulating layer comprises applying a mask over the first insulating layer, plurality of electrodes, and interconnect layer, wherein the mask generally defines the connection region. An electrically insulating paste or epoxy is applied over the first insulating layer, plurality of electrodes, interconnect layer, and mask, and the mask then removed from the first insulating layer, plurality of electrodes, and interconnect layer, therein generally removing the electrically insulative paste or epoxy from the connection region. The electrically insulative paste or epoxy is then cured (e.g., fired in a kiln), wherein the electrically insulative paste or epoxy is generally solidified.

It should be noted that thicknesses of the first insulating layer, plurality of electrodes, interconnect layer, and second insulating layer can be increased by repeating the respective act of formation of the individual layers, and such repetition is contemplated as falling within the scope of the present invention. Furthermore, such repetition of the aforementioned acts can advantageously provide for greater performance and/or robustness of the resulting J-R clamp.

It should also be noted, for example, that the aforementioned "pastes" can be substituted with respective "epoxies" throughout, wherein "firing" generally refers to a "curing" or hardening of the epoxy or paste. In a preferred embodiment, the first insulating layer, plurality of electrodes, interconnect layer, and second insulating layer are comprised of respective pastes formed over the ceramic layer, wherein each of the pastes are respectively fired at a predetermined firing temperature in a kiln. Alternatively, one or more of the pastes, for example, may comprise respective epoxies, wherein firing the respective paste generally refers to a curing of the respective epoxy at a lower curing temperature than the predetermined firing temperature. Such epoxies, for example, are used if no subsequent firing of the clamp at the predetermined firing temperature is required, such as when all of the first insulating layer, plurality of electrodes, interconnect layer, and second insulating layer comprise respective epoxies, or when only latter layers comprise a respective epoxy. Alternatively, the first insulating layer may comprise a paste fired at the predetermined firing temperature, while the plurality of electrodes, interconnect layer, and second insulating layer are comprised of epoxies that are cured at the lower curing temperature. Consequently, all such paste and/or epoxy applications are contemplated as falling within the scope of the present invention.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A J-R electrostatic clamp for clamping a wafer, the electrostatic clamp comprising:
   a J-R type ceramic layer having a clamping surface whereon the wafer resides and a backside surface generally opposite the clamping surface;
   a plurality of electrically conductive electrodes arranged across the backside surface of the ceramic layer in a predetermined manner, the plurality of electrodes being distributed about an interior region and a peripheral region of the backside surface, wherein each electrode in the interior region is associated with a respective one or more electrodes in the peripheral region, wherein a plurality of electrode groups are generally defined;
   a first insulating layer formed over and between the plurality of electrode groups, wherein the first insulating layer generally electrically isolates the plurality of electrode groups from one another; and
   an interconnect layer comprising a plurality of electrically conductive vias and interconnects, wherein the plurality of vias generally extend through the first insulating layer and electrically connect to each of the plurality of electrodes, wherein the plurality of interconnects are formed over the first insulating layer and electrically connect the vias associated with each electrode group, wherein the plurality of electrode groups are electrically isolated from one another, and wherein the interconnect layer further comprises a plurality of connection nodes, wherein each connection node is respectively electrically connected to each electrode group, wherein each node is operable to electrically connect to a respective voltage potential.

2. The J-R electrostatic clamp of claim 1, wherein the first insulating layer is comprised of a dielectric material.

3. The J-R electrostatic clamp of claim 2, wherein the first insulating layer is comprised of a fired dielectric paste or cured dielectric epoxy.

4. The J-R electrostatic clamp of claim 3, wherein the first insulating layer is comprised of a plurality of layers of fired dielectric paste or cured dielectric epoxy.

5. The J-R electrostatic clamp of claim 1, further comprising a second insulating layer formed over the interconnect layer except for a connection region wherein the connection nodes generally reside, wherein the second insulating layer generally encapsulates the interconnect layer.

6. The J-R electrostatic clamp of claim 5, wherein the second insulating layer is comprised of a dielectric material.

7. The J-R electrostatic clamp of claim 6, wherein the second insulating layer is comprised of a fired dielectric paste or cured dielectric epoxy.

8. The J-R electrostatic clamp of claim 7, wherein the second insulating layer is comprised of a plurality of layers of fired dielectric paste or cured dielectric epoxy.

9. The J-R electrostatic clamp of claim 1, wherein the J-R type ceramic layer comprises one or more of titania-doped alumina and cerium oxide-doped aluminum nitride.

10. The J-R electrostatic clamp of claim 1, wherein a thickness of the ceramic layer is 0.5 mm or more.

11. The J-R electrostatic clamp of claim 1, wherein the plurality of electrodes are comprised of a fired electrically conductive paste or cured electrically conductive epoxy.

12. The J-R electrostatic clamp of claim 1, wherein the plurality of electrodes comprise one or more of silver, an alloy of silver, gold, and an alloy of gold.

13. The J-R electrostatic clamp of claim 1, wherein the interconnect layer is comprised of a fired electrically conductive paste or cured electrically conductive epoxy.

14. The J-R electrostatic clamp of claim 13, wherein the interconnect layer is comprised of a plurality of layers of fired electrically conductive paste or cured electrically conductive epoxy.

15. The J-R electrostatic clamp of claim 1, wherein the interconnect layer comprises one or more of silver, an alloy of silver, gold, and an alloy of gold.

16. The J-R electrostatic clamp of claim 1, further comprising one or more holes therethrough, wherein the ceramic layer comprises one or more gas distribution channels associated with the clamping surface, and wherein the one or more holes generally permit a flow of gas therethrough to the one or more gas distribution channels.

17. A method for forming a J-R electrostatic clamp, the method comprising:
   providing a J-R type ceramic base having a clamping surface and a backside surface generally opposite the clamping surface;
   patterning a plurality of electrodes over the backside surface of the ceramic base;
   patterning a first insulating layer over the plurality of electrodes, wherein the first insulating layer generally electrically insulates the plurality of electrodes from one another; and
   patterning an electrically conductive interconnect layer over the first insulating layer, therein forming a plurality of vias and interconnects, wherein the interconnect layer electrically connects two or more of the plurality of electrodes, therein defining a plurality of electrode groups.

18. The method of claim 17, wherein patterning the plurality of electrodes comprises:
   applying a mask over the backside surface, wherein the mask generally defines a plurality of insulative regions and a plurality of electrode regions on the backside surface;
   applying an electrically conductive paste over the backside surface and mask;
   removing the mask from the backside surface, therein generally removing the electrically conductive paste from the insulative regions and defining the plurality of electrodes; and
   firing the electrically conductive paste, wherein the electrically conductive paste is generally solidified.

19. The method of claim 17, wherein patterning the first insulating layer comprises:
   applying a mask over the backside surface and plurality of electrodes, wherein the mask generally defines a plurality of via regions over the plurality of electrodes;
   applying an electrically insulating paste over the backside surface, electrodes, and mask;
   removing the mask from the backside surface and electrodes, therein generally removing the electrically insulative paste from the plurality of via regions; and
   firing the electrically insulative paste, wherein the electrically insulative paste is generally solidified.

20. The method of claim 19, wherein patterning the interconnect layer comprises:
   applying a mask over the first insulating layer and plurality of electrodes, wherein the mask generally defines a plurality of interconnect regions generally connecting two or more of the plurality of via regions;

applying an electrically conductive paste over the first insulating layer, plurality of electrodes, and mask, wherein the electrically conductive paste generally fills the plurality of via regions and interconnect regions;

removing the mask from the first insulating layer and plurality of electrodes, therein defining the plurality of vias and interconnects; and firing the electrically conductive paste, wherein the electrically conductive paste is generally solidified.

21. The method of claim 19, wherein the acts of claim 19 are repeated until a thickness of the first insulating layer is sufficient to generally prevent electrical breakdown of the plurality of electrodes.

22. The method of claim 17, wherein patterning the interconnect layer comprises:

applying a mask over the first insulating layer and plurality of electrodes, wherein the mask generally defines one or more of a plurality of via regions associated with the plurality of electrodes and a plurality of interconnect regions generally connecting two or more of the plurality of via regions;

applying an electrically conductive paste over the first insulating layer, plurality of electrodes, and mask, wherein the electrically conductive paste generally fills the plurality of via regions and interconnect regions;

removing the mask from the first insulating layer and plurality of electrodes, therein defining the plurality of vias and interconnects; and firing the electrically conductive paste, wherein the electrically conductive paste is generally solidified.

23. The method of claim 17, wherein patterning the interconnect layer comprises:

applying a mask over the first insulating layer and plurality of electrodes, wherein the mask generally defines a plurality of via regions associated with the plurality of electrodes;

applying an electrically conductive paste over the first insulating layer, plurality of electrodes, and mask, wherein the electrically conductive paste generally fills the plurality of via regions;

removing the mask from the first insulating layer and plurality of electrodes, therein defining the plurality of vias; and firing the electrically conductive paste, wherein the electrically conductive paste is generally solidified;

applying another mask over the first insulating layer and plurality of electrodes, wherein the mask generally defines a plurality of interconnect regions generally connecting two or more of the plurality of via regions applying another electrically conductive paste over the first insulating layer, plurality of electrodes, and mask, wherein the electrically conductive paste generally fills the plurality of interconnect regions;

removing the another mask from the first insulating layer and plurality of electrodes, therein defining the plurality of interconnects; and firing the another electrically conductive paste, wherein the electrically conductive paste is generally solidified.

24. The method of claim 17, further comprising patterning a second insulating layer over the interconnect layer, wherein the second insulating layer generally encapsulates the interconnect layer, except for a connection region associated with an electrical connection to the plurality of interconnects.

25. The method of claim 24, wherein patterning the second insulating layer comprises:

applying a mask over the first insulating layer, plurality of electrodes, and interconnect layer, wherein the mask generally defines the connection region;

applying an electrically insulating paste over the first insulating layer, plurality of electrodes, interconnect layer, and mask;

removing the mask from the first insulating layer, plurality of electrodes, and interconnect layer, therein generally removing the electrically insulative paste from the connection region; and firing the electrically insulative paste, wherein the electrically insulative paste is generally solidified.

26. The method of claim 17, further comprising electrically connecting a power source to the plurality of electrodes.

* * * * *